United States Patent [19]

Hada

[11] Patent Number: 5,930,675
[45] Date of Patent: Jul. 27, 1999

[54] PROCESS OF FORMING INTER-LEVEL CONNECTION WITHOUT INCREASE OF CONTACT RESISTANCE

[75] Inventor: Hiromitsu Hada, Tokyo, Japan

[73] Assignee: NEC Corporation, Toky, Japan

[21] Appl. No.: 08/632,908

[22] Filed: Apr. 16, 1996

[30] Foreign Application Priority Data

Apr. 21, 1995 [JP] Japan .................................... 7-96628

[51] Int. Cl.⁶ .......................................... H01L 21/4763
[52] U.S. Cl. ..................... 438/647; 438/637; 438/658; 438/659; 438/672
[58] Field of Search .................................... 438/637, 647, 438/65.9, 471, 623, 658, 622, 784, 672

[56] References Cited

U.S. PATENT DOCUMENTS

| 4,843,034 | 6/1989 | Hetndon et al. ........................ 438/622 |
| 5,418,180 | 5/1995 | Brown ........................................ 437/60 |

*Primary Examiner*—Charles Bowers
*Assistant Examiner*—Reneé R. Berry
*Attorney, Agent, or Firm*—Laff, Whitesel & Saret, Ltd.

[57] ABSTRACT

A natural oxide on an amorphous silicon exposed to a miniature contact hole is thermally decomposed in vacuum and an amorphous silicon is grown on the amorphous silicon without exposing to the atmosphere; the amorphous silicon is applied with heat so as to be epitaxially grown on a single crystal silicon beneath the amorphous silicon, thereby forming a conductive plug in the miniature contact hole.

8 Claims, 9 Drawing Sheets

N-TYPE IMPURITY

PROCESS OF FORMING INTER-LEVEL CONNECTION WITHOUT INCREASE OF CONTACT RESISTANCE

FIELD OF THE INVENTION

This invention relates to a process of forming an inter-level connection and, more particularly, to a process of forming an inter-level connection between conductive patterns without increase of a contact resistance.

DESCRIPTION OF THE RELATED ART

A large scale integration has a multi-layer structure, and inter-level insulating layers provide electrical isolation between conductive patterns on different levels. In order to electrically connect a conductive pattern to another conductive pattern on a different level, contact holes are formed in the inter-level insulating layers, and the conductive pattern vertically extends through the contact holes so as to be brought into contact with the conductive pattern on the different level.

An inter-level insulating layer topographically extends over a lower conductive pattern, and, accordingly, transfers an inequality due to a lower conductive pattern to the upper surface thereof. However, such a rolling surface is not desirable for forming a contact hole through a lithographic process. For this reason, a manufacturer supplements insulating substance, and makes the top surface of the inter-level insulating layer smooth before the formation of the contact holes.

Although the supplement of insulating substance is desirable for the lithographic process, the insulating substance increases the thickness of the inter-level insulating layer. In this situation, if the contact holes are miniaturized, the aspect ratio is increased, and a disconnection is liable to take place.

A conductive plug prevents the conductive strip from the disconnection, and FIGS. 1A to 1G illustrates a typical example of the process of plugging a contact hole.

First, insulating substance is deposited over a major surface of a p-type single crystal silicon substrate 1 having an n-type impurity region 1a, and the major surface is overlain by an inter-level insulating layer 2 as shown in FIG. 1A.

An appropriate photo-resist etching mask 3 is formed on the inter-level insulating layer 2, and exposes an area of the inter-level insulating layer 2 over the n-type impurity region 1a. The photo-resist etching mask 3 allows a dry etchant to anisotropically etch the exposed portion of the inter-level insulating layer 2, and a contact hole 2a is formed in the inter-level insulating layer 2. The n-type impurity region 1a is exposed to the contact hole 2a as shown in FIG. 1B.

The photo-resist etching mask 3 is stripped off, and n-type impurity is ion implanted through the contact hole 2a into the n-type impurity region 1a. The ion-bombardment makes a surface portion 1b of the n-type impurity region 1a amorphous. Natural oxide is unavoidably grown on the amorphous surface portion 1b, and the amorphous surface portion 1b is covered with a silicon oxide layer 4 as shown in FIG. 1C.

The silicon oxide layer 4 is etched away in hydrofluoric acid, and the amorphous surface portion 1b is exposed to the contact hole 2a again as shown in FIG. 1D.

Subsequently, polysilicon is going to be grown over the entire surface of the structure. The resultant structure shown in FIG. 1D is transferred from the etching system to a low-pressure chemical vapor deposition system. When the result ant structure is placed in a reaction chamber of the low-pressure chemical vapor deposition system, the amorphous surface portion 1b is exposed to the atmosphere, and the amorphous silicon reacts with the oxygen. For this reason, the amorphous surface portion 1b is overlain by a silicon oxide layer 5 again as shown in FIG. 1E.

The structure shown in FIG. 1E is placed in a reaction chamber of the low-pressure chemical vapor deposition system, and polysilicon is deposited over the entire surface at 620 to 650 degrees in centigrade. The polysilicon fills the contact hole 2a, and a polysilicon layer 6 covers the upper surface of the inter-level insulating layer 2 as shown in FIG. 1F. The amorphous surface portion is recrystallized during the deposition of polysilicon.

The polysilicon layer 6 is uniformly etched without an etching mask until the inter-level insulating layer 2 is exposed again, and a polysilicon plug 6a is left in the contact hole 2a.

Finally, a conductive substance is deposited over the entire upper surface of the inter-level insulating layer 2, and the conductive substance is patterned into a wiring strip 7 held in contact with the polysilicon plug 6a as shown in FIG. 1G.

Although the polysilicon plug 6a prevents the wiring strip 7 from disconnection, the contact resistance is non-ignoreably large between the polysilicon plug 5 and the n-type impurity region 1a. If the contact hole 2a is miniaturized, the contact resistance becomes serious.

An etching damaged layer and the silicon oxide layer 5 are causative of the large contact resistance. In detail, while the anisotropic dry etching is forming the contact hole 2a, the dry etchant damages the surface of the n-type impurity region 1a exposed to the contact hole 2a, and a thin damaged region takes place. The silicon of the thin damaged region is mixed with the silicon therebeneath during the ion-implantation, and forms the amorphous surface portion 1b. Although the amorphous silicon portion 1b is recrystallized during the deposition of polysilicon, the influence of the thin damaged region remains in the surface of the n-type impurity region, and increases the contact resistance together with the silicon oxide layer 5.

Japanese Patent Publication of Unexamined Application No. 2-32541 discloses a method of selectively removing a damaged layer due to an ion bombardment. A radical beam is radiated to the damaged layer under the condition that the etching rate is different between the damaged layer and a non-damaged single crystal semiconductor.

The Japanese Patent Publication of Unexamined Application is silent to the removal of the silicon oxide layer unavoidably grown during the insertion into the reaction chamber of the chemical vapor deposition system. Therefore, even if the damaged layer is removed before the growth of polysilicon, the silicon oxide layer 5 is left between the n-type impurity region 1a and the polysilicon plug 6a, and the silicon oxide layer 5 increases the contact resistance in a miniature contact hole.

SUMMARY OF THE INVENTION

It is therefore an important object of the present invention to provide a process of forming an inter-level connection which does not increase a contact resistance.

To accomplish the object, the present invention proposes to decompose natural oxide in vacuum or low-pressure hydrogen atmosphere.

In accordance with the present invention, there is provided a process for forming an inter-level connection in a semiconductor device, comprising the steps of: a) preparing a multi-level structure including a lower crystal semiconductor layer and an inter-level insulating layer covering the lower conductive member; b) forming a contact hole in the inter-level insulating layer so as to expose the lower crystal semiconductor layer to the contact hole; c) converting a surface portion of the lower crystal semiconductor layer to a first amorphous semiconductor material, the first amorphous semiconductor material of the surface portion partially reacting with oxygen so that the surface portion is covered with an oxide layer; d) decompose the oxide so as to remove the oxide layer from the surface portion; e) growing a second amorphous semiconductor material on the first amorphous semiconductor material of the surface portion without exposing the surface portion to an oxidizing atmosphere between the step d) and the step e), the second amorphous semiconductor material swelling into an amorphous semiconductor layer extending on the inter-level insulating layer; f) converting the first amorphous semiconductor material of the surface portion and at least a part of the second amorphous semiconductor material in the contact hole to a crystal semiconductor material merged to a remaining portion of the lower crystal semiconductor layer by using a solid phase epitaxial growing technique; and g) forming an upper conductive layer extending on the inter-level insulating layer electrically connected to the crystal semiconductor material in the contact hole.

BRIEF DESCRIPTION OF THE DRAWINGS

The features and advantages of the process of forming an inter-level connection according to the present invention will be more clearly understood from the following description taken in conjunction with the accompanying drawings in which.

DESCRIPTION OF THE PREFERRED EMBODIMENTS

First Embodiment

FIGS. 2A to 2G illustrate a process of forming an inter-level connection embodying the present invention. The process starts with preparation of a p-type single crystal silicon substrate 11, and an n-type impurity region 11a is formed in an area of a major surface of the p-type single crystal silicon substrate 11.

Figure 1A:
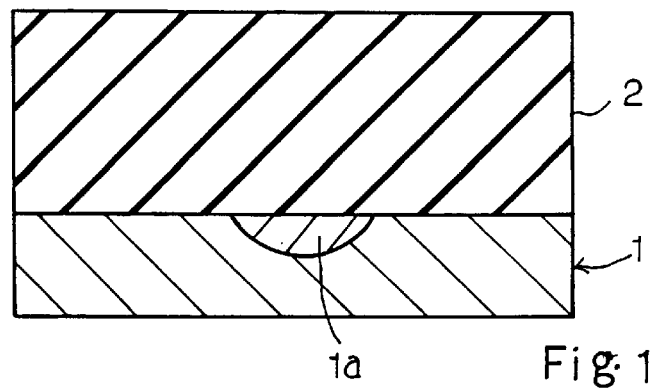
FIGS. 1A to 1G are cross sectional views showing the prior art process for plugging a contact hole.
Figure 1B:
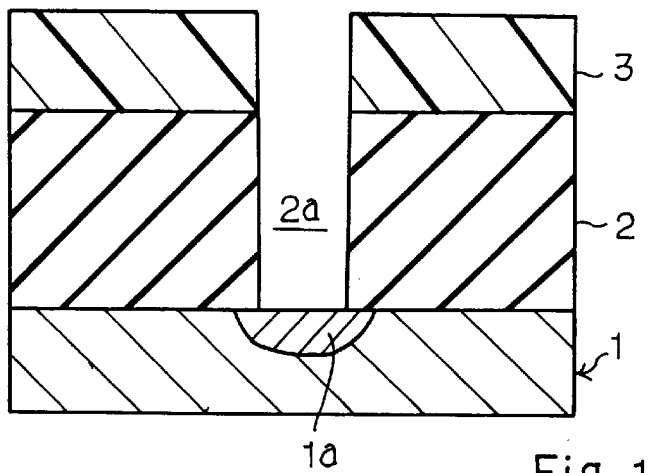
Figure 1C:
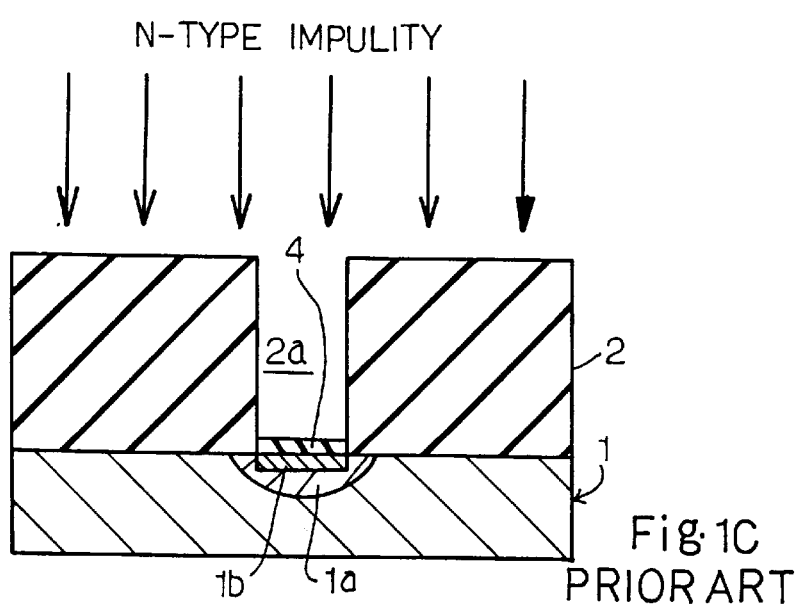
Figure 1D:
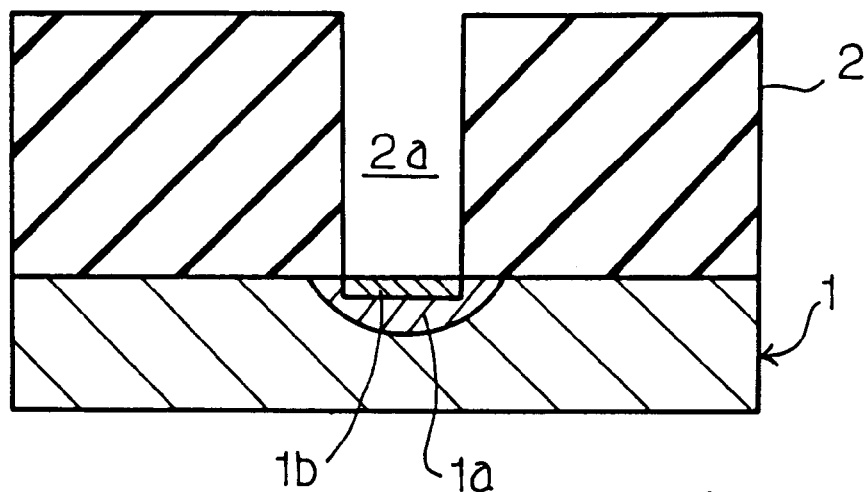
Figure 1E:
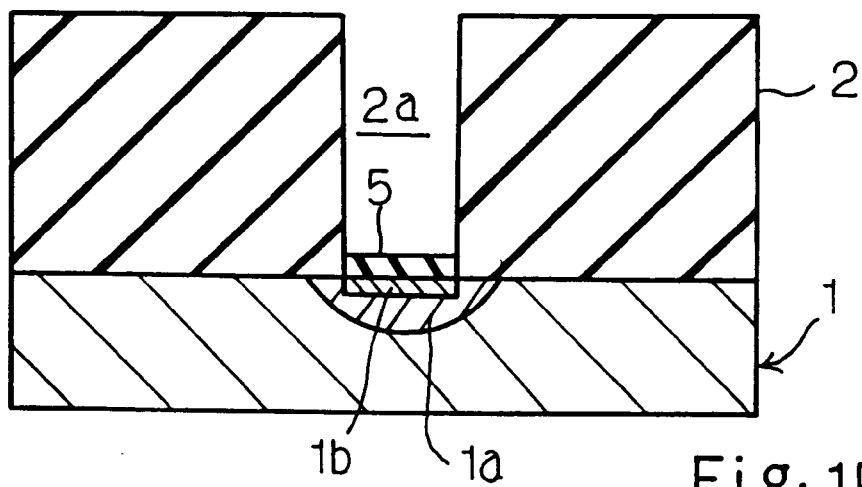
Figure 1F:
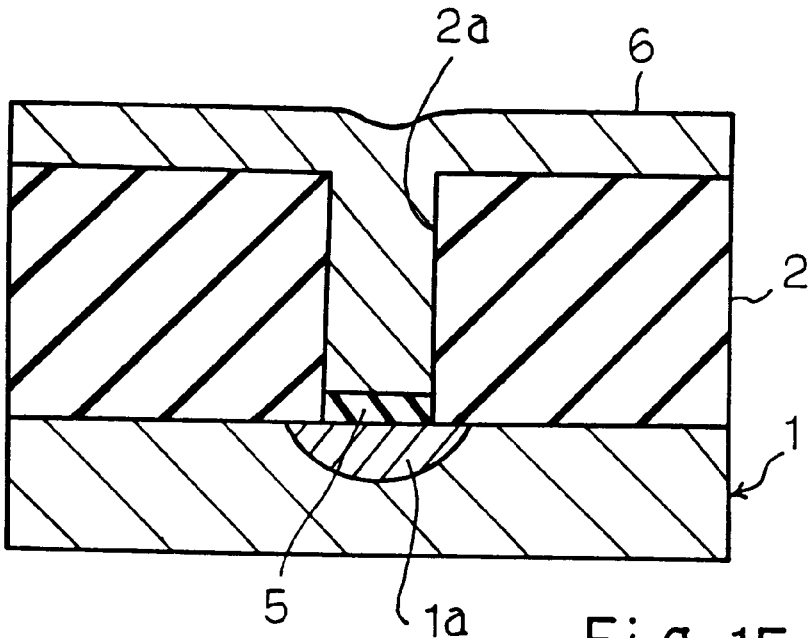
Figure 1G:
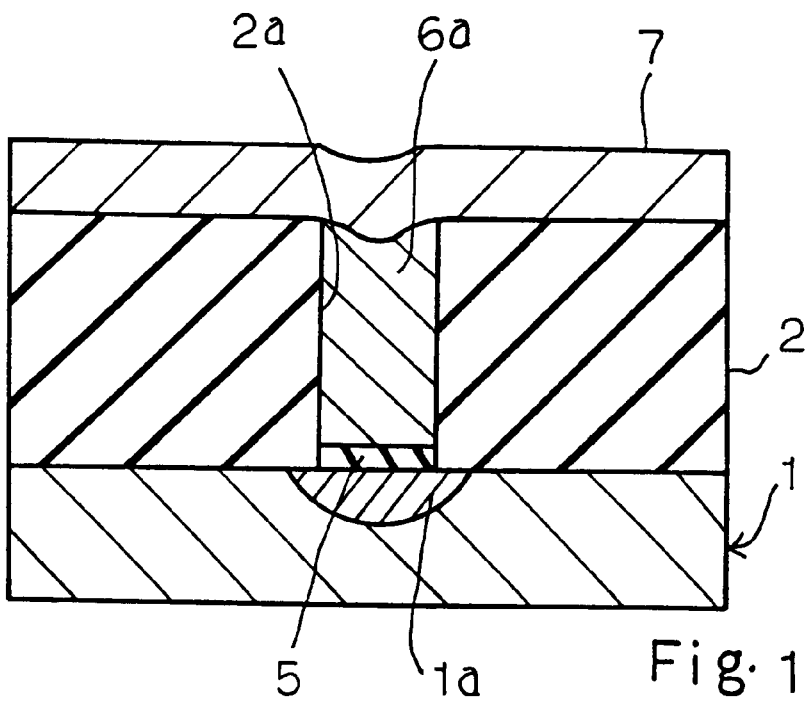
Figure 2A:
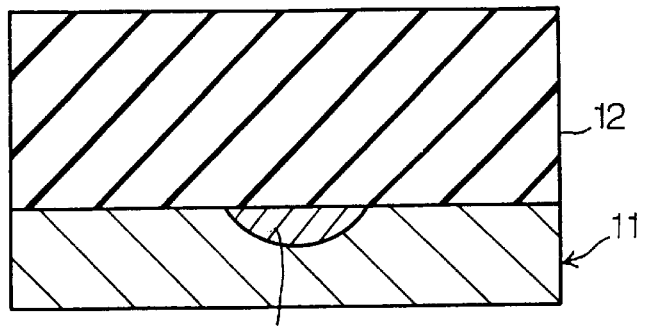
FIGS. 2A to 2H are cross sectional views showing a process of forming an interconnection between different levels according to the present invention.

Silicon oxide is deposited over the p-type single crystal silicon substrate 11, and the n-type impurity region 11a and the major surface are covered with an inter-level silicon oxide layer 12 as shown in FIG. 2A.

Photo-resist solution is spread over the upper surface of the inter-level silicon oxide layer 12, and a photo-resist etching mask 13 is formed form the photo-resist layer by using lithographic techniques. The photo-resist etching mask 13 exposes an area of the inter-level silicon oxide layer 12 over the n-type impurity region 11a.

Figure 2B:
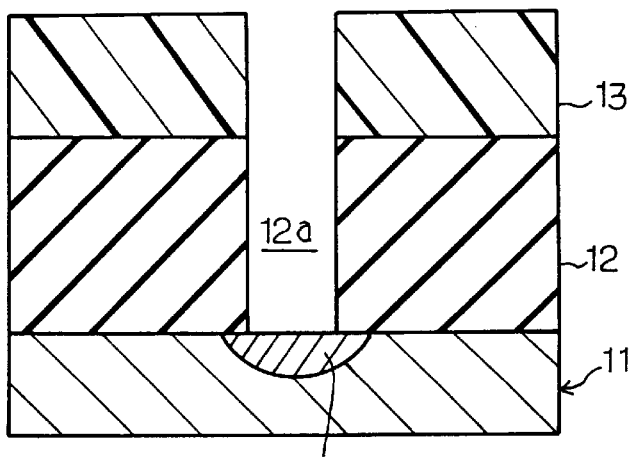

The inter-level silicon oxide layer 12 is anisotropically etched away by using a dry etching, and the n-type impurity region 11a is exposed to a contact hole 12a formed in the inter-level silicon oxide layer 12 as shown in FIG. 2B.

The photo-resist mask 13 is stripped off, and n-type impurity is ion implanted at dose of $1 \times 15^{15}$ cm$^{-2}$ to $1 \times 10^{16}$ cm$^{-2}$ through the contact hole 12a into the n-type impurity region 11a. The ion-bombardment makes a surface portion 11b amorphous, and silicon oxide is grown on the amorphous surface portion 11b. As a result, the amorphous surface portion 11b is covered with a silicon oxide layer 13 as similar to the amorphous surface portion 1b.

Figure 2C:
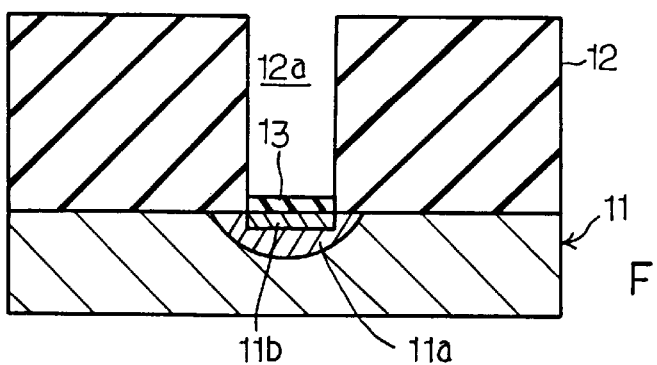

The resultant structure shown in FIG. 2C is placed on a heater 14a in a reaction chamber 14b of a chemical vapor deposition system 14. The reaction chamber 14b is connected to a vacuum pump 14c and a gas supply sub-system 14d. The heater 14a is connected to a variable electric power source 14e, and heats the p-type single crystal silicon substrate 11 to an arbitrary temperature.

Figure 2D:
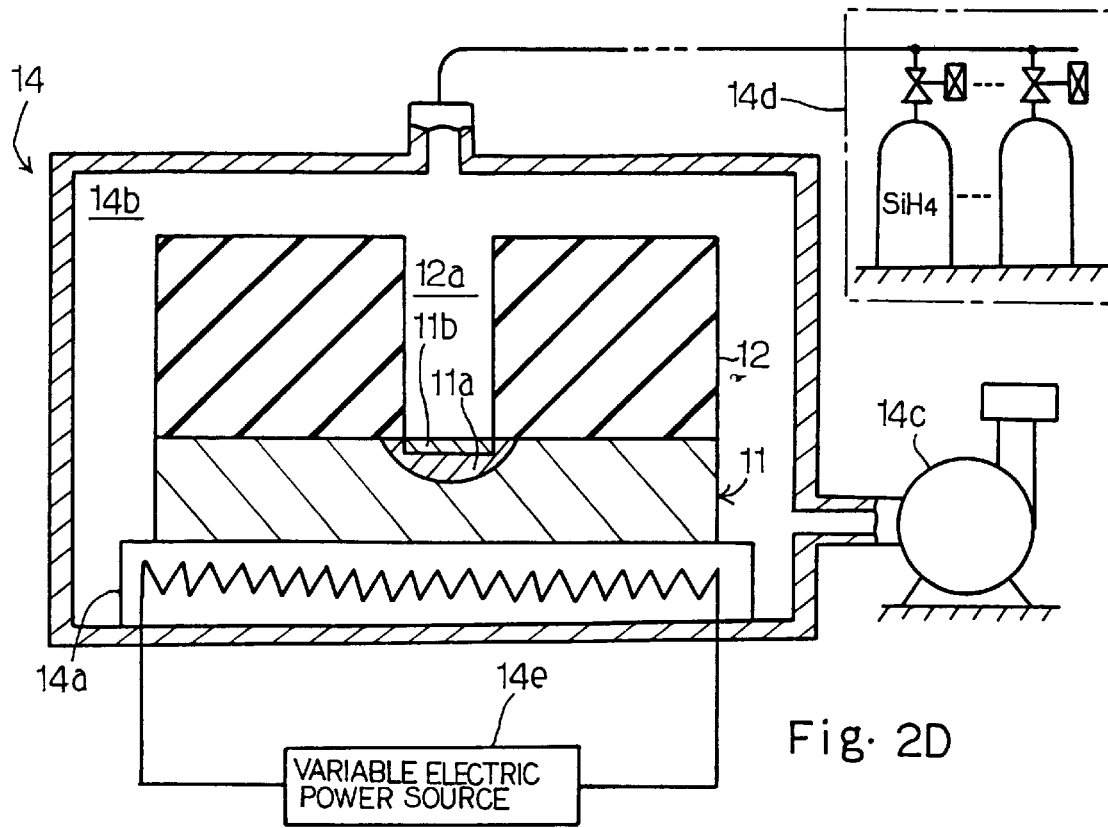

The vacuum pump 14c develops vacuum in the reaction chamber 14b, and the reaction chamber 14b is maintained at at least $10^{-8}$ to $10^{-9}$ torr. The heater 14a heats the p-type single crystal silicon substrate 11 to 750 to 800 degrees in centigrade. The silicon oxide of the layer 13 was grown at a lower temperature, and the composition is imperfect. For this reason, the silicon oxide is decomposed in the above temperature range, and the oxygen is evacuated from the reaction chamber 14b. As a result, the silicon oxide layer 13 is removed from the surface portion 11b as shown in FIG. 2D.

Figure 2E:
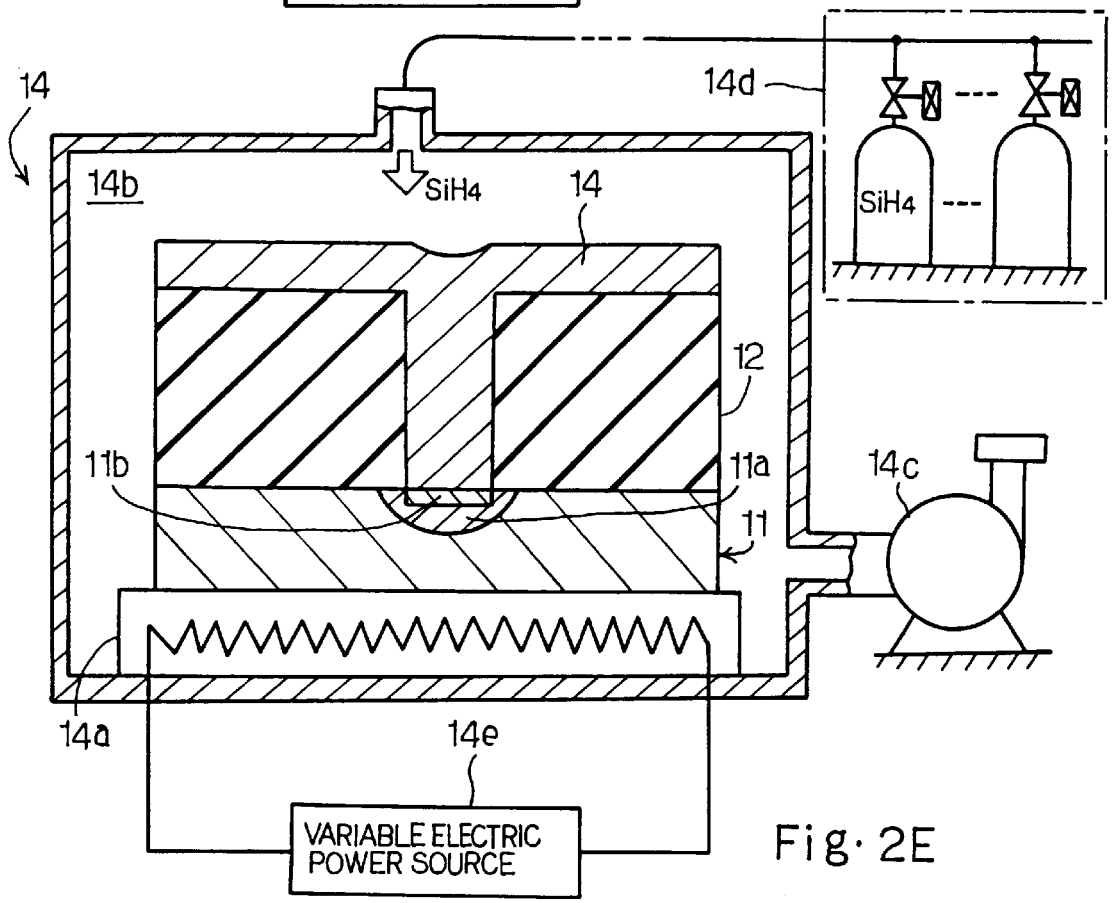

Subsequently, process gas containing silane is introduced from the gas supply system 14d into the reaction chamber 14b without exposure of the amorphous surface portion 11b to the atmosphere, and the silane is pyrolyzed at 470 to 510 degrees in centigrade. Amorphous silicon is deposited over the entire surface of the resultant structure shown in FIG. 2D, and fills the contact hole 12a. Thus, the inter-level silicon oxide layer 12 is overlain by an amorphous silicon layer 14 as shown in FIG. 2E. No silicon oxide layer remains at the boundary between the amorphous surface portion 11b and the amorphous silicon layer 14, because the amorphous surface portion 11b has been exposed to an oxidizing atmosphere after the removal of the silicon oxide layer 13.

Figure 2F:
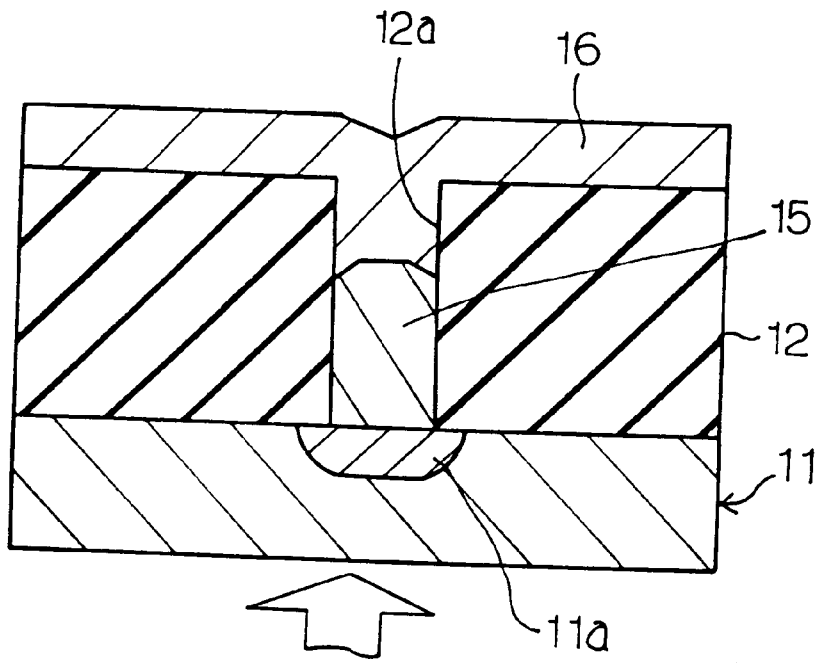

Subsequently, the amorphous silicon layer 14 is heated to 520 to 600 degrees in centigrade for a solid-state epitaxial growth, and the amorphous silicon is recrystallized from the boundary between the n-type impurity region 11a and the amorphous surface portion. The recrystallized silicon is epitaxially merged with the single crystal silicon of the n-type impurity region 11a. The crystal silicon 15 extends from the boundary through the contact hole 12a toward the upper surface of the amorphous silicon layer 14 as shown in FIG. 2F, because a silicon oxide layer has not been formed at the boundary. The solid-phase epitaxial growth is carried out by using the heater 14a or another heating system outside of the reaction chamber 14b. In this instance, the amorphous silicon in the contact hole 12a is partially recrystallized, and the remaining amorphous silicon 14 is converted to polysilicon 16.

Figure 2G:
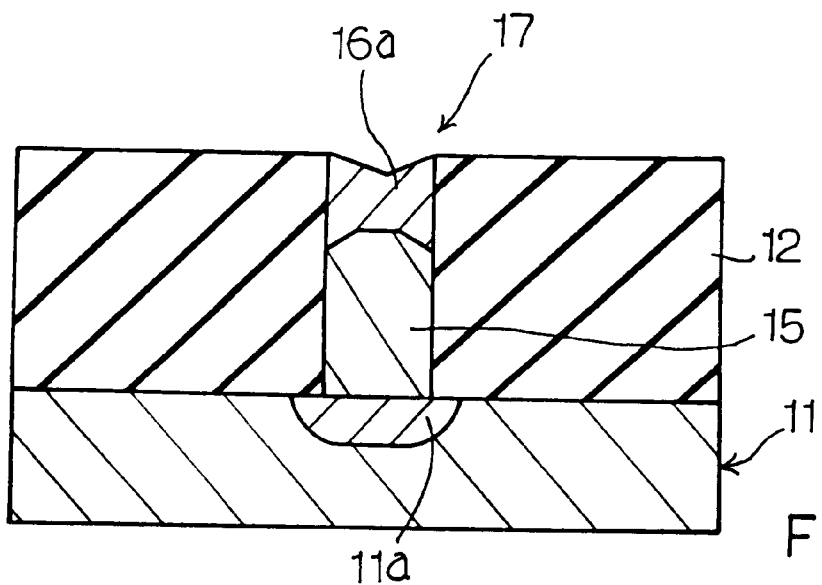

The polysilicon layer 16 is uniformly etched without an etching mask until the inter-level silicon oxide layer 12 is exposed. A piece of polysilicon 16a is left in the upper portion of the contact hole 12a, and the crystal silicon 15 and the piece of polysilicon 16a form a conductive plug 17 as shown in FIG. 2G.

Figure 2H:
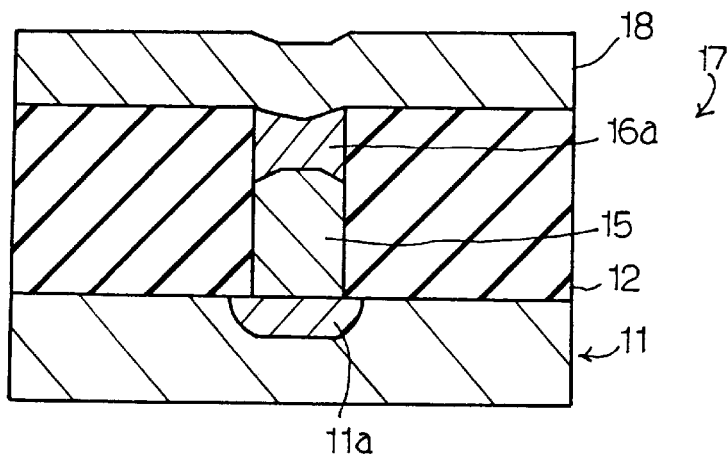

A conductive substance such as, for example, polysilicon is deposited over the entire surface of the inter-level silicon oxide layer 12, and is held in contact with the conductive plug 16a. An appropriate photo-resist etching mask (not shown) is formed on the conductive layer, and the conductive layer is patterned into an upper wiring strip 18 as shown in FIG. 2H.

The crystal silicon 15 is epitaxially grown on the n-type impurity region 11a, and a boundary does not take place therebetween. For this reason, contact resistance is drastically decreased. While the solid-phase epitaxial technique is growing the crystal silicon, the damaged layer is cured, and the damaged surface portion is removed.

The present inventor evaluated the interconnection between the n-type impurity region 11a and the upper wiring strip 18. The present inventor fabricated the conductive plug 17 in the contact hole 12a through the process illustrated in FIGS. 2A to 2H, and the contact hole 12a was 0.15 micron in diameter and 0.5 micron in depth. The present inventor further fabricated the conductive plug 6a in the contact hole 2a through the prior art process shown in FIGS. 1A to 1G. The contact hole 2a was identical in dimension with the contact hole 12a.

Figure 3:
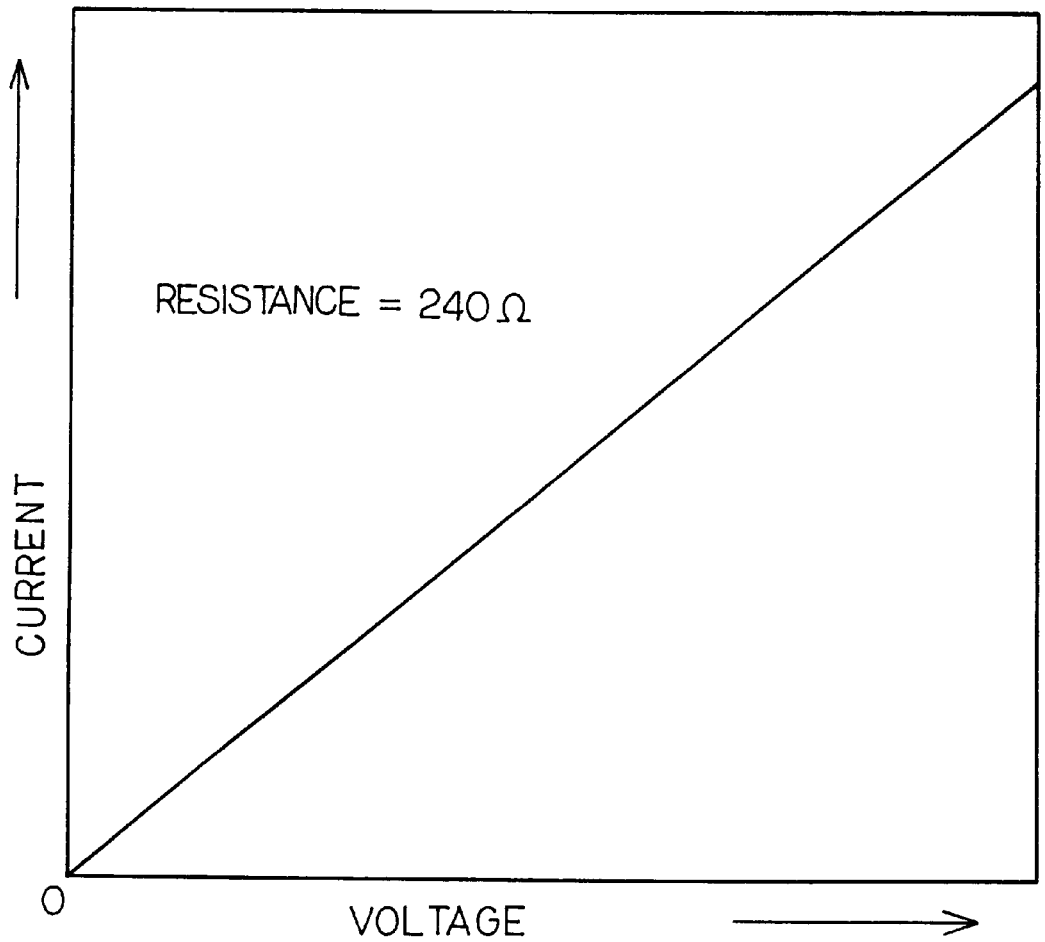
FIG. 3 is a graph showing voltage-to-current characteristics of the interconnection formed through the process according to the present invention.

The present inventor applied potential across the conductive plugs 17 and 6a, and measured the current passing through the conductive plugs 17 and 6a. The current passing through the conductive plug 17 was plotted as shown in FIG. 3, and the resistance was 240 ohms.

Figure 4:
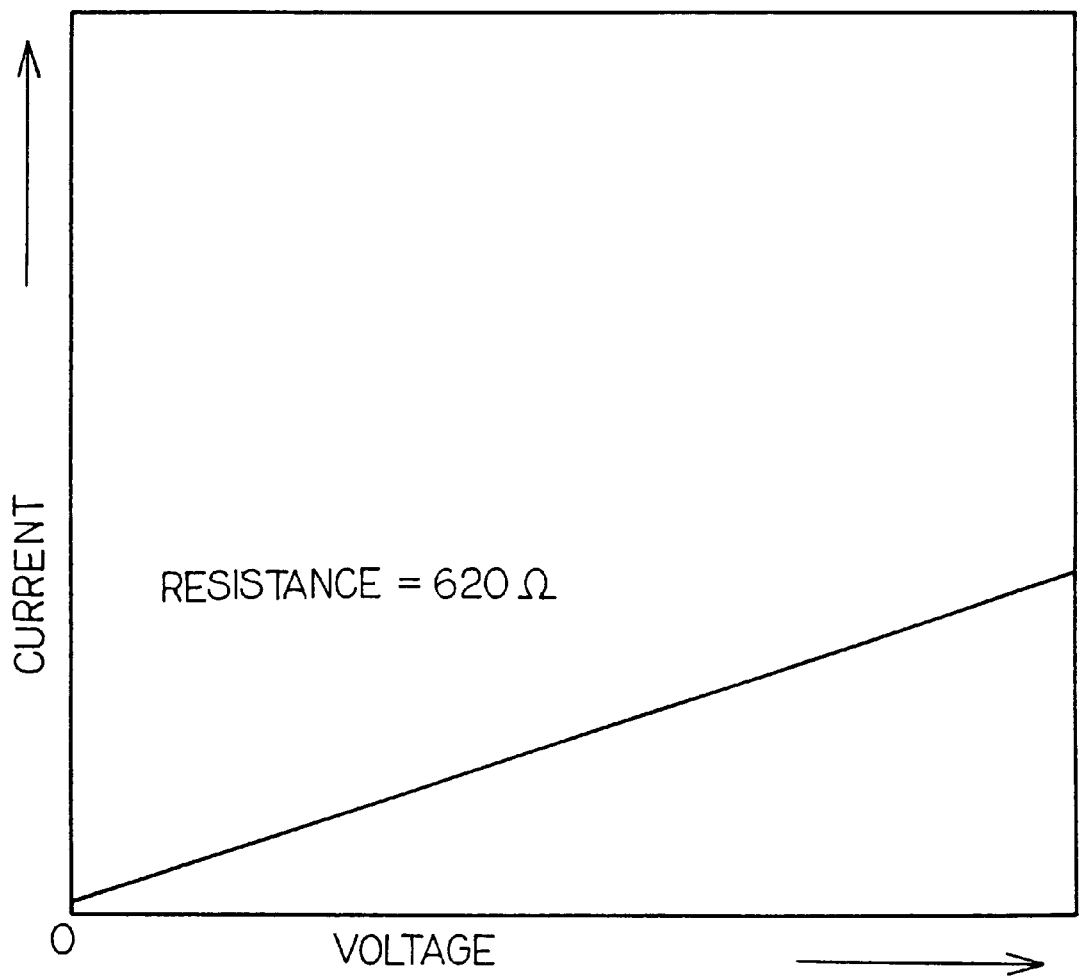
FIG. 4 is a graph showing voltage-to-current characteristics of the interconnection formed through the prior art process.

On the other hand, the current passing through the conductive plug 6a was plotted as shown in FIG. 4, and the resistance was 620 ohms.

The resistivity of silicon in the contact holes 2a and 12a was approximately equal to $700 \times 10^{-6}$ ohm-cm, and the resistances Rp of the conductive plugs 6a and 17 were given by equation 1.

$$Rp = 700 \times 10^{-6} \times \frac{0.5 \times 10^{-4}}{pi \times (0.075 \times 10^{-4})^2} \quad \text{Equation 1}$$

$$= 198 \text{ (ohms)}$$

Therefore, the contact resistance of the prior art plug 6a was 422 ohms, and the contact resistance of the conductive plug 17 was 42 ohms. Thus, the contact resistance of the conductive plug 17 was a tenth of the contact resistance of the prior art conductive plug 6a.

In this instance, the semiconductor material is silicon, and the n-type impurity region 11a serves as the lower crystal semiconductor layer. The conductive wiring strip 18 serves as the upper conductive layer.

As will be appreciated from the foregoing description, the perfect removal of silicon oxide allows the crystal silicon 15 to be epitaxially grown on the n-type impurity region 11a, and the crystal silicon 15 effectively decreases the contact resistance.

Second Embodiment

The conductive plug 17 is fabricated through another process embodying the present invention. The process sequence implementing the second embodiment is similar to the first embodiment except for the removal of a silicon oxide layer 13, and, for this reason, description is focused on the different step.

Figure 5:
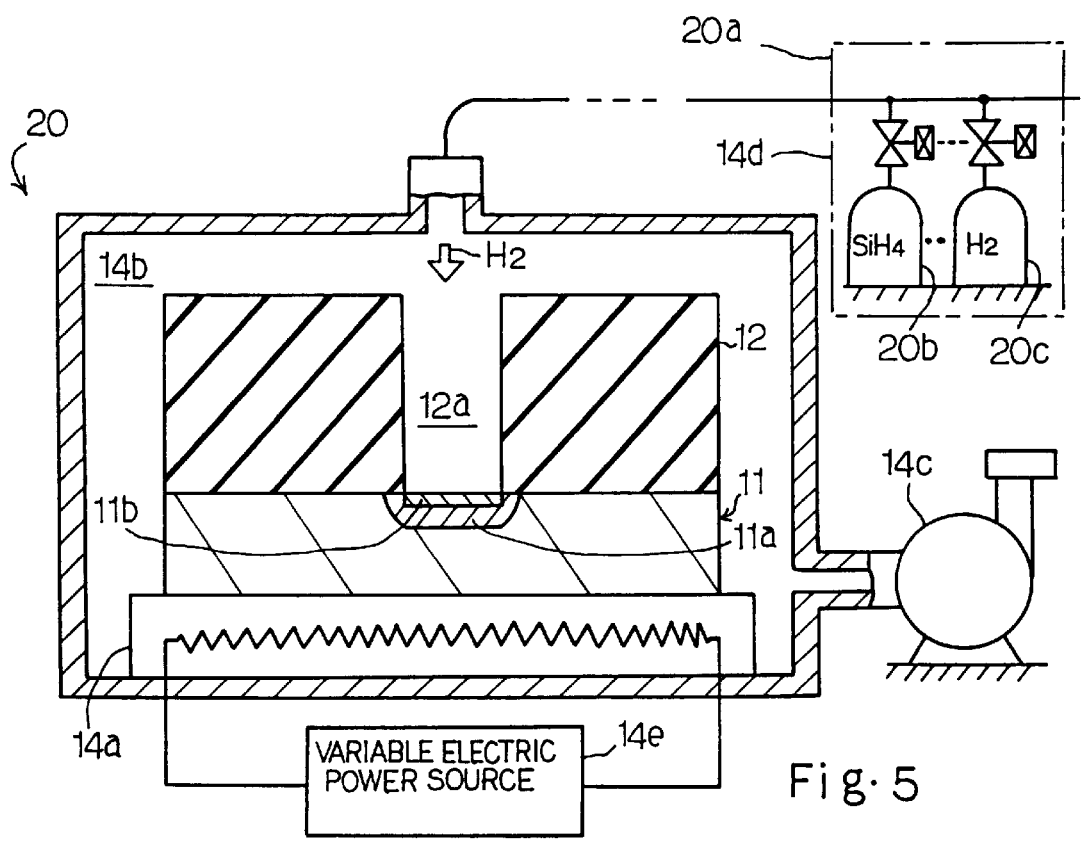
FIG. 5 is a cross sectional view showing the step of removing a silicon oxide layer carried out in another process embodying the present invention.

FIG. 5 illustrates the step of removing a silicon oxide layer 13, and the chemical vapor deposition system 20 comprises the heater 14a, the reactor defining the chamber 14b, the vacuum pump 14c, the variable electric power source 14e and a gas supply sub-system 20a. The gas supply sub-system 20a includes not only the source 20b of silane but also a source 20c of hydrogen.

The removal of the silicon oxide layer 13 is carried out as follows. The vacuum pump 14c develops vacuum in the reaction chamber 14b, and the source 20c of hydrogen supplies hydrogen gas to the reaction chamber 14b. The vacuum pump 14c maintains the reaction chamber 14b at least $10^{-5}$ torr. The heater 14a heats the silicon oxide layer 13 as similar to that of the first embodiment, and decomposes the silicon oxide. The oxygen decomposed from the silicon oxide reacts with hydrogen, and the vacuum pump 14c evacuates the water vapor from the reaction chamber 14b.

The other steps are similar to those of the first embodiment, and no further description is incorporated hereinbelow for avoiding repetition.

Although particular embodiments of the present invention have been shown and described, it will be obvious to those skilled in the art that various changes and modifications may be made without departing from the spirit and scope of the present invention.

For example, the resultant structure shown in FIG. 2D may be inserted into a perfectly sealed package so as to transfer it from a vacuum chamber to a deposition system.

The polysilicon layer 16 may directly patterned into the upper wiring strip 18.

What is claimed is:

1. A process for forming an inter-level connection in a semiconductor device, comprising the steps of:

a) preparing a multi-level structure including a lower crystal semiconductor layer and an inter-level insulating layer covering said lower crystal semiconductor layer;

b) forming a contact hole in said inter-level insulating layer so as to expose said lower crystal semiconductor layer to said contact hole;

c) converting a surface portion of said lower crystal semiconductor layer to a first amorphous semiconductor material, said first amorphous semiconductor material of said surface portion partially reacting with oxygen so that said surface portion is covered with an oxide layer;

d) decomposing said oxide layer so as to remove said oxide layer from said surface portion;

e) growing a second amorphous semiconductor material on said first amorphous semiconductor material of said surface portion without exposing said surface portion to a reactive atmosphere with said first amorphous semiconductor material between said step d) and said step e), said second amorphous semiconductor material swelling into an amorphous semiconductor layer extending on said inter-level insulating layer;

f) converting said first amorphous semiconductor material of said surface portion and at least a part of said second amorphous semiconductor material in said contact hole to a crystal semiconductor material merged with a remaining portion of said lower crystal semiconductor layer by using a solid phase epitaxial growing technique; and g) forming an upper conductive layer extending on said inter-level insulating layer and electrically connected to said crystal semiconductor material in said contact hole.

2. The process as set forth in claim 1, in which said an ion-implantation converts said surface portion of said lower crystal semiconductor layer to said first amorphous semiconductor material in said step c).

3. The process as set forth in claim 1, in which heat decomposes said oxide layer in vacuum in said step d).

4. The process as set forth in claim 3, in which said oxide layer is formed of silicon oxide, and said silicon oxide is heated to 750 degrees to 800 degrees in centigrade so as to be decomposed.

5. The process as set forth in claim 1, in which heat decomposes said oxide layer in a low-pressure hydrogen atmosphere in said step d).

6. The process as set forth in claim 1, in which heat is applied to said first and second amorphous semiconductor materials so that said solid-phase epitaxial growing technique converts said first and second amorphous semiconductor materials to said crystal semiconductor material from a boundary between said surface portion and said remaining portion in said step f).

7. The process as set forth in claim 6, in which a remaining part of said second amorphous semiconductor material is converted to a polycrystal semiconductor material in said step f), said upper conductive layer being held in contact with a piece of said polycrystal semiconductor material in said contact hole.

8. A process for forming an inter-level connection in a semiconductor device, comprising the steps of:

a) preparing a multi-level structure including a lower crystal semiconductor layer and an inter-level insulating layer covering said lower crystal semiconductor layer;

b) forming a contact hole in said inter-level insulating layer so as to expose said lower crystal semiconductor layer to said contact hole;

c) converting a surface portion of said lower crystal semiconductor layer to a first amorphous semiconductor material, said first amorphous semiconductor material of said surface portion partially reacting with oxygen so that said surface portion is covered with an oxide layer;

d) decomposing said oxide layer so as to remove said oxide layer from said surface portion;

e) growing a second amorphous semiconductor material on said first amorphous semiconductor material of said surface portion without exposing said surface portion to the atmosphere between said step d) and said step e), said second amorphous semiconductor material swelling into an amorphous semiconductor layer extending on said inter-level insulating layer;

f) converting said first amorphous semiconductor material of said surface portion and at least a part of said second amorphous semiconductor material in said contact hole to a crystal semiconductor material merged with a remaining portion of said lower crystal semiconductor layer by using a solid phase epitaxial growing technique; and g) forming an upper conductive layer extending on said inter-level insulating layer and electrically connected to said crystal semiconductor material in said contact hole.

* * * * *